(12) United States Patent
Hosaka

(10) Patent No.: US 6,475,897 B1
(45) Date of Patent: Nov. 5, 2002

(54) SEMICONDUCTOR DEVICE AND METHOD OF FORMING SEMICONDUCTOR DEVICE

(75) Inventor: Takashi Hosaka, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/639,709

(22) Filed: Aug. 14, 2000

(30) Foreign Application Priority Data

Nov. 10, 1999 (JP) .......................................... 11-320159

(51) Int. Cl.[7] .............................................. H01L 29/30
(52) U.S. Cl. ................................. 438/617; 228/180.22
(58) Field of Search ................................. 438/108, 612, 438/613, 617, 106, 343; 257/737, 738, 780, 784, 777, 778; 228/180.22

(56) References Cited

U.S. PATENT DOCUMENTS

| | | | | |
|---|---|---|---|---|
| 5,444,300 A | * | 8/1995 | Sato et al. | 257/737 |
| 5,508,561 A | * | 4/1996 | Tago et al. | 257/737 |
| 5,607,877 A | * | 3/1997 | Matsuda et al. | 438/613 |
| 5,889,326 A | * | 3/1999 | Tanaka | 257/737 |
| 5,908,317 A | * | 6/1999 | Heo | 438/617 |
| 5,977,643 A | * | 11/1999 | You et al. | 257/784 |

FOREIGN PATENT DOCUMENTS

JP          62-281435       * 12/1987

* cited by examiner

Primary Examiner—Kamand Cuneo
Assistant Examiner—Alonzo Chambliss
(74) Attorney, Agent, or Firm—Adams & Wilks

(57) ABSTRACT

A semiconductor device, such as an IC package, having the same size as an IC chip and having improved qualities is manufactured at a low cost by a particular manufacturing method. The semiconductor device has stepped-projection bumps bonded to electrode pads on a semiconductor substrate in which a semiconductor element is formed. A column portion and a portion in a horizontal portion of each stepped-projection bump are exposed while the other portion of the bump is covered with a protective material. When windows of the protective material corresponding to the column portions are formed, the windows are patterned by using a masking material based on a photoetching method, and the protective material is removed by etching.

9 Claims, 6 Drawing Sheets

SEMICONDUCTOR DEVICE AND METHOD OF FORMING SEMICONDUCTOR DEVICE

BACKGROUND OF THE INVENTION

1. Field of the Invention

The present invention relates to a semiconductor device having a so-called chip-size package structure in which a size thereof is equal to an integrated circuit (IC) chip, and to a method of manufacturing the chip-size package.

2. Description of the Related Art

IC packages called chip-size packages have been manufactured in such a manner that they are formed after the step of separating their IC chips from each other.

Conventional IC packages necessarily have a certain amount of marginal portion such as to enable ICs to be packed therein, and are substantially larger in size than the ICs although they are called "chip-size packages".

Moreover, the process of manufacturing such IC packages is complicated and requires a high manufacturing cost, and the manufacturing period is long.

SUMMARY OF THE INVENTION

In view of the above-described problem, an object of the present invention is to provide a method of manufacturing IC packages in the wafer state, and an IC package having the same size as its IC chip. That is, bumps are bonded to electrode pads of chips on a wafer, a protective material is applied thereto, and bump portions are exposed by a masking technique. Thereafter, the wafer is cut along scribe lines to complete IC packages.

DESCRIPTION OF THE PREFERRED EMBODIMENTS

The present invention relates to a technique for providing an IC package having the same size as its integrated circuit (IC) chip. An embodiment of the present invention will be described with reference to the accompanying drawings.

Figure 1:
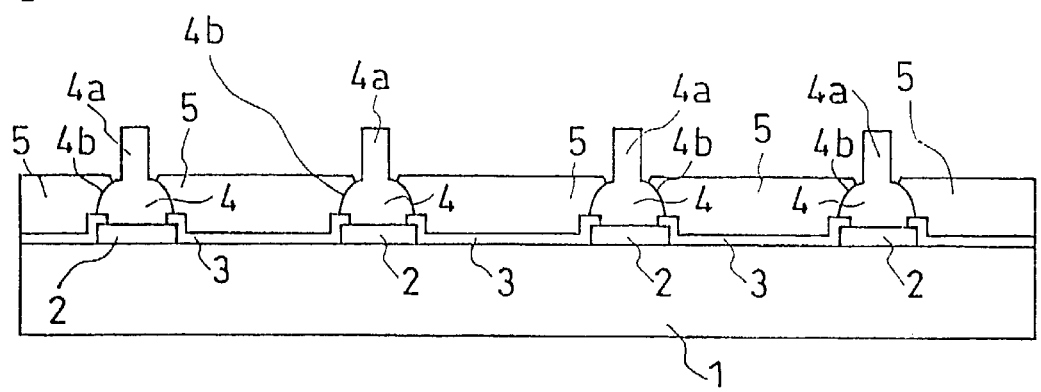
FIG. 1 is a diagram showing the structure of an IC package of a wafer formed as a semiconductor device in accordance with the present invention.

FIG. 1 is a cross-sectional view of the structure of IC packages formed in wafer size in accordance with the present invention. Electrode pads 2 are formed on a surface of a semiconductor substrate 1. The surface of the semiconductor substrate 1 is covered with a protective film 3. Integrated circuits, not shown in FIG. 1, are formed in the semiconductor substrate. IC chips are formed as described above.

According to the present invention, bumps 4 are bonded to electrode pads 2 of each IC chip. Each bump 4 has a projection shape such as shown in FIG. 1. The surface of the IC chip is covered with a protective material 5. A column 4a forming a stepped-projection portion of each bump 4 is exposed and is used as a contact for connection to an external electrode. The protective material 5 has a discontinuity at a horizontal portion in the stepped-projection portion of each bump 4. The IC package constructed as described above is characterized by (1) having the same size as the IC chip, and (2) having the IC chip completely covered with protective material 5. Any extraneous substances are thereby prevented from entering the IC chip from an external environment. For example, there is substantially no possibility of water entering from the outside. Therefore, there is no problem relating to water in the IC chip, e.g., the problem of corrosion of the electrode pads.

Figure 2A:
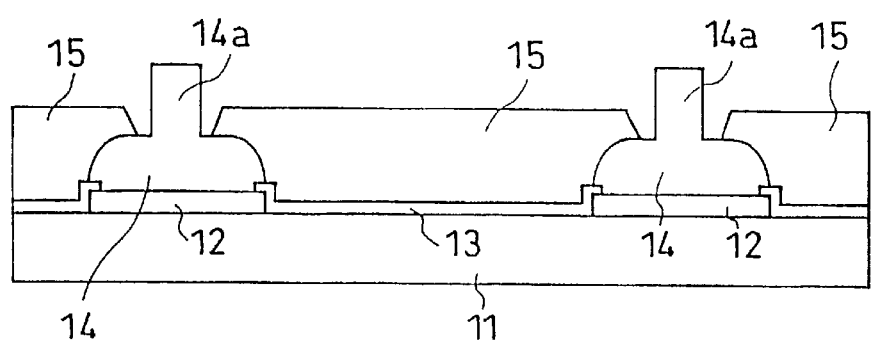
FIGS. 2A and 2B are diagrams showing a mounting state of the semiconductor device of the present invention.
Figure 2B:
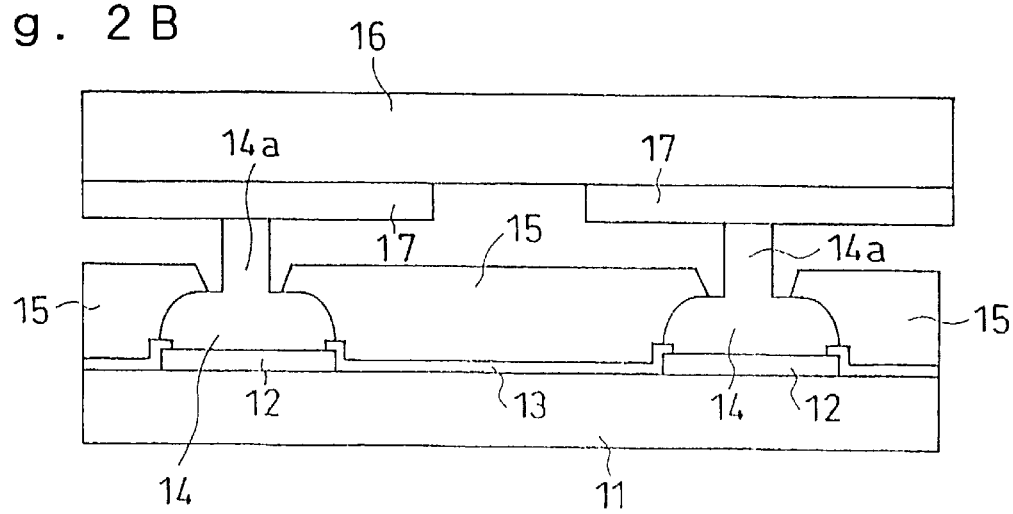

The above-described IC package is also characterized in that (3) since the column 4a of each bump 4 protrudes beyond the protective material 5, connections to external electrodes are easy to establish. This effect will be described with reference to FIGS. 2A and 2B. FIG. 2A shows in section the structure of one IC package separated from a set of IC packages formed in wafer size as shown in FIG. 1. FIG. 2B shows a state where the IC package shown in FIG. 2A is mounted on a mount substrate. Wiring conductors 17 are formed on a surface of the mount substrate 16. The wiring conductors 17 and columns 14a of bumps 14 are bonded to each other. The columns 14a of the bumps 14 can be easily connected to the external wiring conductors 17, since they protrude beyond the protective material 15.

The above-described IC package is further characterized in that (4) since the protective material 5 firmly holds the IC chip, the strength of IC package is markedly increased relative to that of the IC chip in a state of existing alone; and that (5) the structure is so simple that the manufacturing cost including the prices of materials is markedly low.

As described above, the IC package of the present invention can be used as a chip-size package.

The method of manufacturing IC packages in accordance with the present invention will next be described in detail.

Figure 3A:
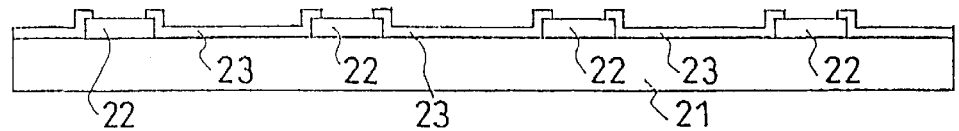
FIGS. 3A to 3C are diagrams showing a method of manufacturing the semiconductor device of the present invention.

FIG. 3A is a diagram showing a wafer state where IC chips are yet to be cut off. A multiplicity of ICs exist in a wafer. A multiplicity of semiconductor elements are formed in a semiconductor substrate 21, which is formed of a chemical compound semiconductor, such as a silicon (Si) semiconductor or a gallium arsenide semiconductor, or some other semiconductor. The material of electrode pads 22 is aluminum (Al), an aluminum alloy, aluminum with some impurity elements, copper, a copper alloy, copper with some impurity elements, or some other metal. The protective film 23 is a silicon oxide ($SiO_2$) film, a silicon nitride ($SiNx$) film, a polyimide film, or some other insulating film.

Figure 3B:
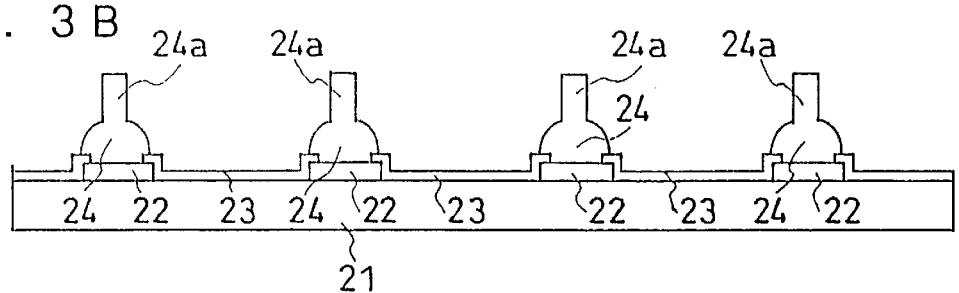
Figure 3C:
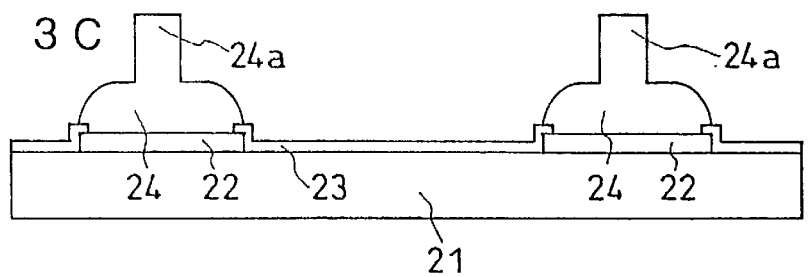

Next, as shown in FIG. 3B, bumps 24 are bonded to electrode pads 22 when the IC chips formed of the multiplicity of ICs are still in the wafer state shown in FIG. 1. FIG. 3(c) is an enlarged diagram of a portion of FIG. 3B, showing details around electrode pads 22. Bumps 24 are formed so as to have a stepped-projection shape such as shown in FIG. 3(c).

Figure 7B:
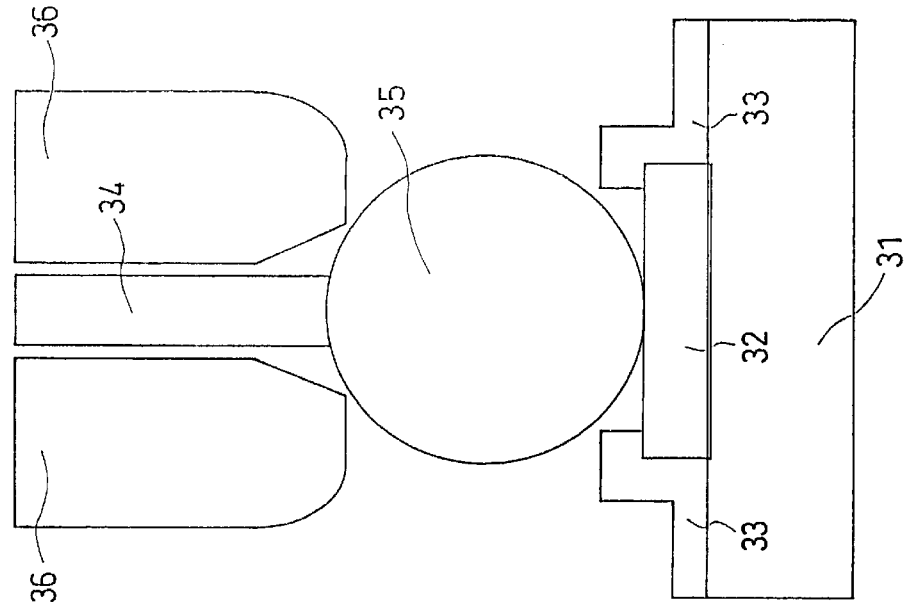
FIGS. 7A and 7B are diagrams showing a method of forming the bump use in the semiconductor device of the present invention.
Figure 7A:
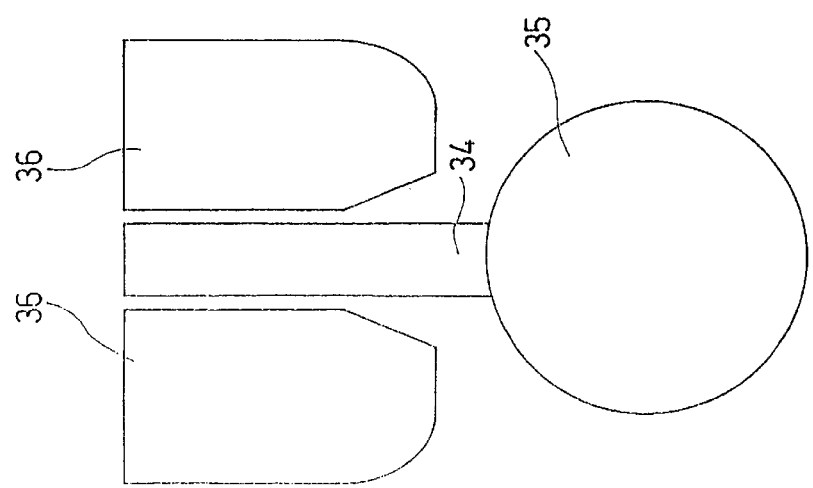
Figure 8:
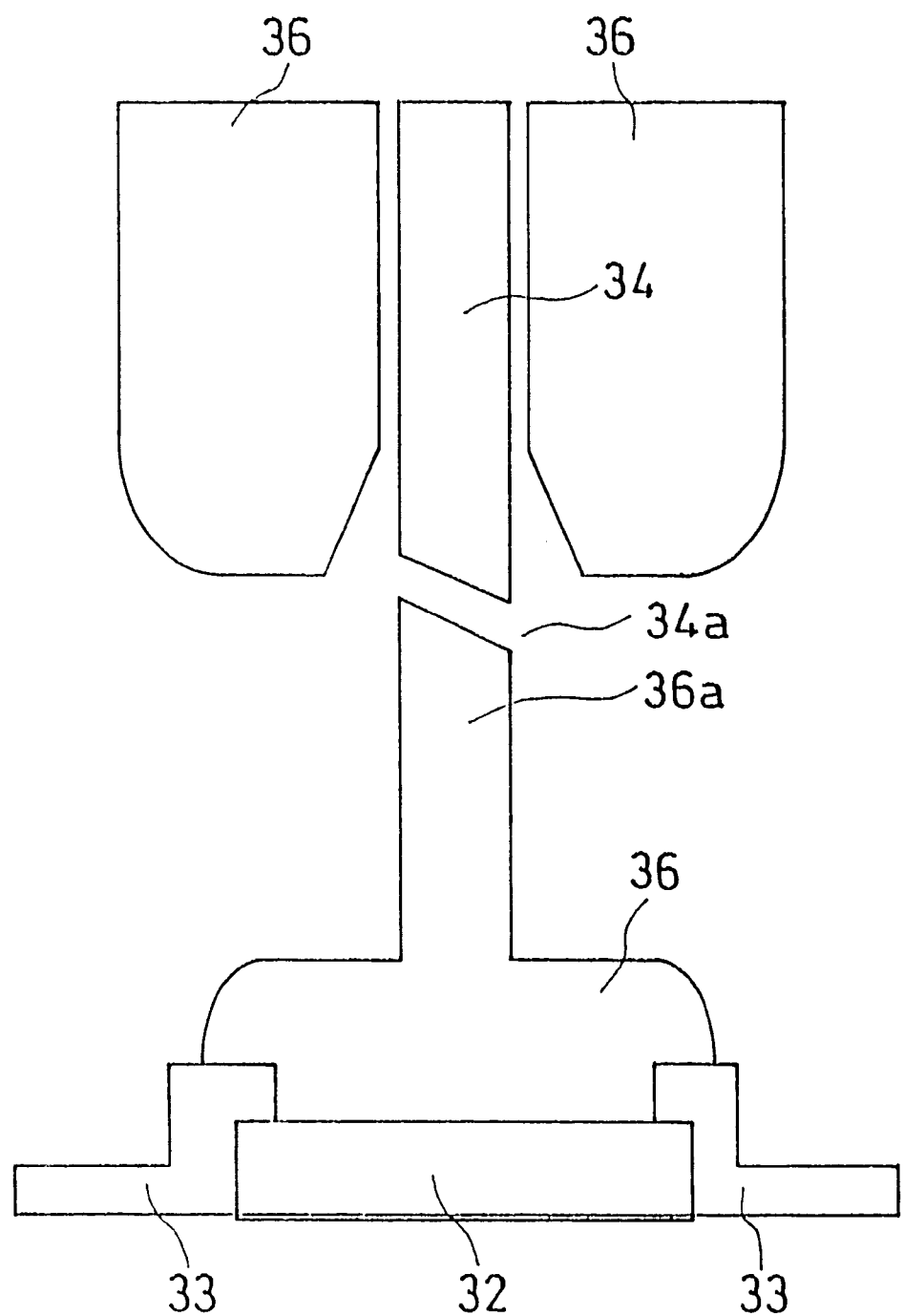
FIG. 8 is a diagram showing the method of forming the bump used in the semiconductor device of the present invention.

One possible method for forming bumps 24 is a method using a wire bonder apparatus, which will be described with reference to FIGS. 7 and 8. Referring to FIG. 7A, a round metal ball 35 is formed on a tip of a metal wire 34 by a wire bonding apparatus. Then, as shown in FIG. 7B, metal ball 35 is pressed against an electrode pad 32 of an IC on a substrate 31 covered by a protective film 33 in the same way as the substrate 1 is covered by a protective film 3 described above, and metal ball 35 and electrode pad 32 are bonded to each other by hot press bonding or ultrasonic press-bonding. Thereafter, as shown in FIG. 8, metal wire 34 is cut at a point 34a such that a predetermined length of metal wire 34 is left, thereby forming a bump 36 and a bump column portion 36a. The above-described process is performed on the wafer level. Seen from the wafer size, there are variations in the height of the bumps 36. Therefore, to make the overall height uniform, a beveling step may be added after the step shown in FIG. 8.

The material of metal wire 34, metal ball 35, and bump 36 is, for example, gold (Au), palladium (Pd), aluminum (Al), silver (Ag), a solder alloy of lead (Pb) and tin (Sn), an alloy of silver (Ag) and tin (Sn), or some other metal.

Figure 4A:
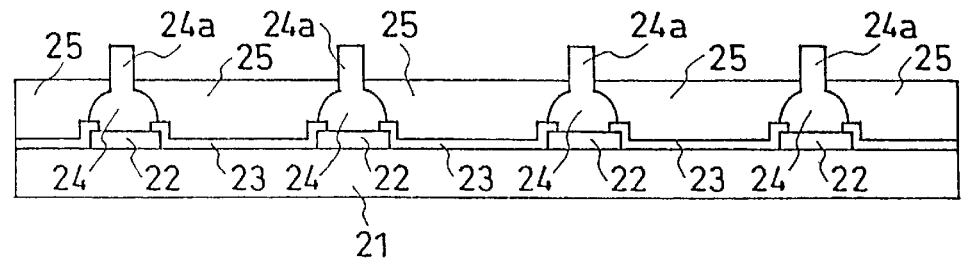
FIGS. 4A and 4B are diagrams showing the method of manufacturing the semiconductor device of the present invention.
Figure 4B:
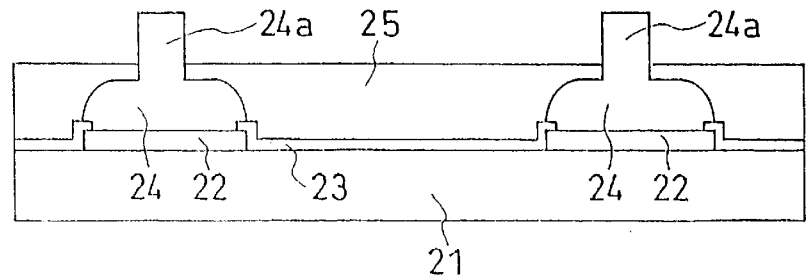

Next a protective material 25 is attached, as shown in FIG. 4A. FIG. 4B is an enlarged diagram of a portion of FIG. 4A, showing details around bumps 24. Protective material 25 may be a liquid material and may be applied to the entire surface of the wafer. It is necessary to determine the thickness of liquid protective material 25 at the time of application by considering the final thickness. That is, the thickness of liquid protective material 25 at the time of application is controlled so that the upper surface of protective material 25 is not finally located above the tips of columns 24a of bumps 24. After application, liquid protective material 25 is baked at a suitable temperature to be solidified.

Figure 5A:
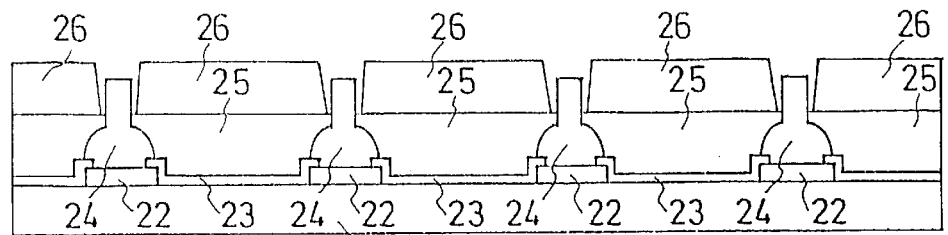
FIGS. 5A to 5C are diagrams showing the method of manufacturing the semiconductor device of the present invention.

Next, as shown in FIG. 5A, a photosentive material such as a photoresist is applied and a mask 26 is formed by a photoetching technique.

Figure 5B:
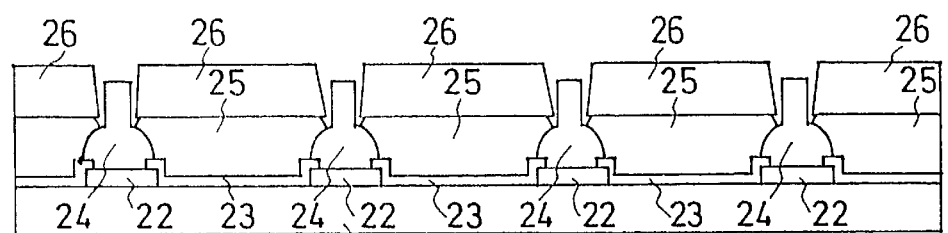
Figure 5C:
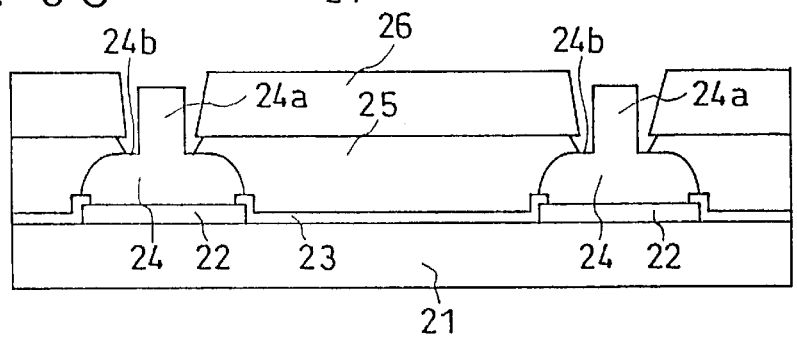

Thereafter, as shown in FIG. 5B, protective material 25 is removed along the edges of mask 26. FIG. 5c is an enlarged diagram of a portion of FIG. 5B, showing details around bumps 24. Mask 26 is formed so as to expose columns 24a of bumps 24 and to have a discontinuity at a horizontal portion 24b of each bump 24. As a method of removing protective material 25, an etching method may be used which has an effect of easily removing protective material 25, but which is not substantially effective in etching mask 26. Alternatively, a dry etching method may be used to remove protective material 25 through open spaces in the mask 26 pattern. It is desirable that protective material 25 should be removed at scribe lines in the wafer so that the wafer can be cut to separate each IC package. In such a case, mask 26 is previously formed so as to be open at the scribe lines.

Figure 6A:
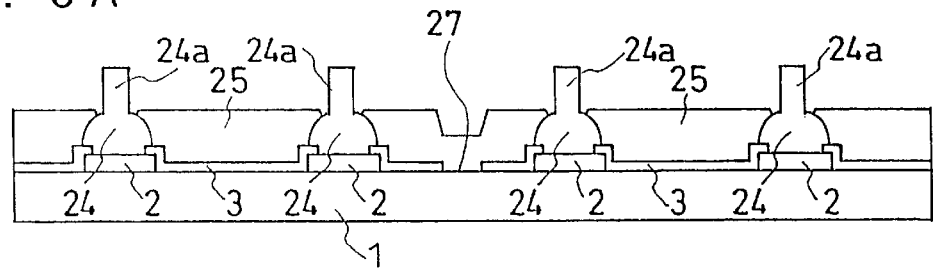
FIGS. 6A and 6B are diagrams showing the method of manufacture the semiconductor device of the present invention.
Figure 6B:
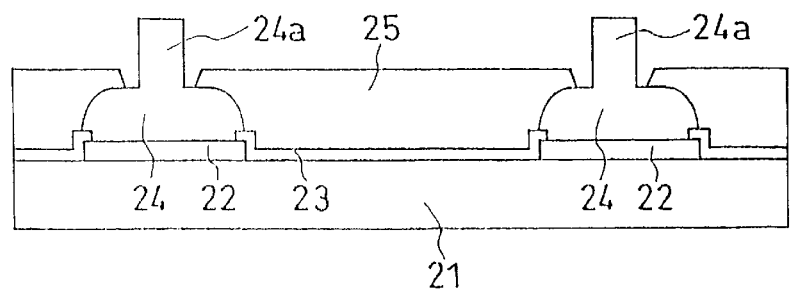

Thereafter, mask 26 is removed, as shown in FIG. 6A. FIG. 6B is an enlarged diagram of a portion of FIG. 6A, showing details around bumps 24. Columns 24a of bumps 24 are exposed and horizontal portions 24b of bumps 24 are also exposed partially. The wafer in this state is annealed at a high temperature to stabilize protective material 25 and to thereby strengthen the ICs mechanically and chemically.

The multiplicity of IC packages are thus formed in the wafer. The process of separating each of the IC packages will next be described. Referring to FIG. 6A, the wafer is cut with a dicing apparatus along each of scribe lines 27 formed in the wafer, thereby separating the IC packages. Before the IC packages are cut off in this manner, protective material 25 at wafer portions to be cut, i.e., at scribe lines 27, may be removed to facilitate cutting along the scribe lines 27.

Figure 9:
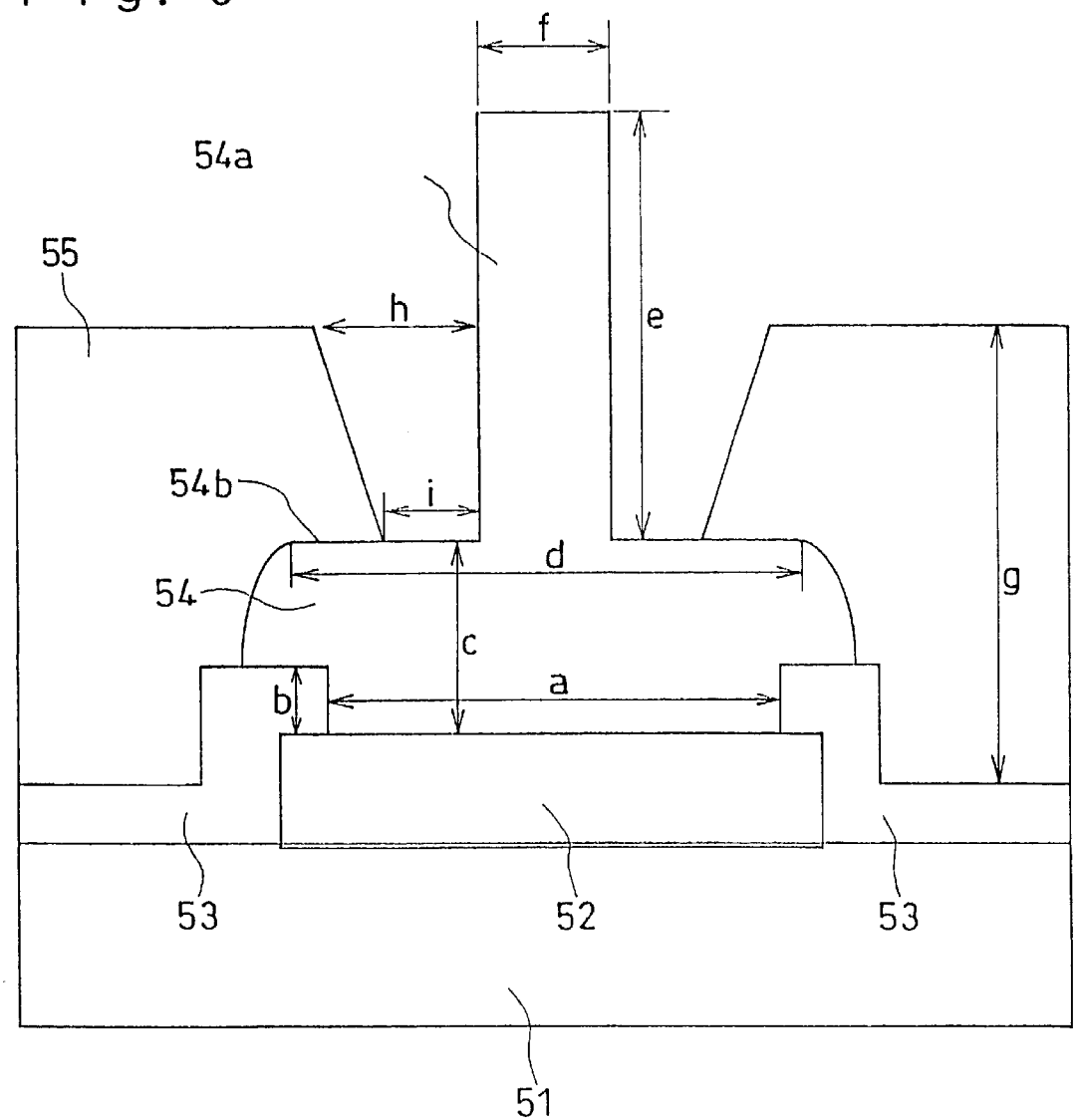
FIG. 9 is a diagram showing dimensions of the semiconductor device of the present invention.

Setting of the height of the bumps and the thickness of the protective material will next be described. These quantities are changed according to environments in which the IC packages will be used. Referring to FIG. 9, let the size of the protective film opening above electrode pad 52 on the substrate 51 be a; the thickness of protective film 53 be b; the height of the flat portion 54b of bump 54 be c; the size of flat portion 54b of the bump 54 be d; the height of column 54a of bump 54 be e; the size of column 54a be f; and the thickness of protective material 55 be g.

The size d of flat portion 54b of bump 54 is ordinarily smaller than the size a of the protective film opening above electrode pad 52. However, if bump 54 can completely cover the protective film opening above electrode pad 52, the size d may be larger than the size a. The size f of column 54a of bump 54 is smaller than the size d of flat portion 54b of bump 54.

The distance h between the upper opening of protective material 55 and the bump column may be close to zero. However, if protective material contacts column 54a of bump 54, there is a risk of failure of connection to the external wiring. Therefore, it is necessary to determine the distance h by considering the mask alignment margin, the accuracy of positioning of bump 54, the accuracy of etching of the protective material, the amount of side etching, etc.

Theoretically, the distance i between the end of flat portion 54b of bump 54 and the lower opening of protective material 55 may be zero. However, the possibility of an extraneous substance such as water entering the IC chip from an external environment is highest therebetween. Therefore, it is necessary that protective material 55 overlaps flat portion 54b of bump 54 without failure. For example, if the bump 54 position accuracy is x µm; the mask alignment error y µm; the protective material 55 etching accuracy z µm; and the side etching amount w µm, i needs to be larger than x+y+z+w.

If bump 54 is formed by wire bonding, the size f of column 54a of bump 54 is determined by the thickness of the metal wire. It is also necessary to determine the design relating to the size f by considering the connection of column 54a to the external wiring.

The height c of flat portion 54b of bump 54 is determined according to the required strength and reliability of the IC package. ordinarily, it may be 10 to 50 µm.

The height e of column 54a of bump 54 is larger than the value obtained by subtracting the height c from the thickness g of protective material 55. It is necessary that the bump head protrudes beyond protective material 55. How distance the bump head must be protruded beyond protective material 55 depends upon the technique for mounting the IC package. However, if it is 10 µm or more, sufficiently high mounting reliability may be ensured.

The thickness g of protective material 55 must be larger than the height c of flat portion 54b of bump 54, since the protective material overlaps flat portion 54b. ordinarily, the thickness g is set to 12 to 70 µm.

In the state illustrated in FIGS. 5 and 6, protective material 55 has its end located on an intermediate point on flat portion 54b. However, needless to say, masking and etching conditions may be selected to expose only the bump column.

According to the present invention, as described above, IC packages are formed in the wafer state, and the number of process steps is therefore reduced, so that the manufacturing cost and the time period between an order and delivery of products can be remarkably reduced. Also, the stepped-projection bumps are used and the protective material covers the horizontal portions of the bumps. The reliability and qualities of the semiconductor device can therefore be improved.

What is claimed is:

1. A method of manufacturing a semiconductor device, comprising the steps of:

forming a semiconductor element in a semiconductor substrate;

bonding a bump having a straight column extending therefrom to an electrode pad of the semiconductor element so that the column extends upward from the semiconductor element;

applying a protective material to cover and protect the semiconductor element and the bump;

partially removing the protective material to expose the column and a portion of the bump surrounding the column;

mounting the semiconductor element having the straight column on a mount substrate; and electrically connecting the bump to a conductor on the mount substrate.

2. A method of manufacturing a semiconductor device according to claim 1; wherein the bump is formed using a wire bonding apparatus.

3. A method of manufacturing a semiconductor device, comprising the steps of:

forming a semiconductor element in a semiconductor substrate;

bonding a bump having a straight column extending therefrom to an electrode pad of the semiconductor element so that the column extends upward from the semiconductor element;

applying a protective material to cover and protect the semiconductor element and the bump;

partially removing the protective material to expose the column;

mounting the semiconductor element having the straight column on a mount substrate; and electrically connecting the bump to a conductor on the mount substrate.

4. A method of manufacturing a semiconductor device according to claim 3; wherein the bump is formed using a wire bonding apparatus.

5. A method of manufacturing a semiconductor device according to any one of claims 1–4; wherein the step of partially removing the protective material is performed using a photoetching method.

6. A method of manufacturing a packaged semiconductor device, comprising the steps of:

forming a semiconductor element in a semiconductor substrate, the semiconductor element having a bonding pad for external connection;

performing a wire bonding process to form a metallic bump on the bonding pad with a straight wire extending from the metallic bump away from the semiconductor element;

cutting the wire so that the wire may serve as an external connection lead;

forming a protective film to cover the semiconductor element and the metallic bump;

partially removing the protective film to expose the wire extending from the bump, so that the semiconductor substrate and the protective film serve as a package of the semiconductor element and the wire serves as an external connection lead for the packaged semiconductor element;

mounting the packaged semiconductor element having the straight column on a mount substrate; and electrically connecting the bump to a conductor on the mount substrate.

7. A method of manufacturing a packaged semiconductor device according to claim 6; further comprising the step of removing the semiconductor device from the semiconductor substrate after forming the protective film.

8. A method of manufacturing a packaged semiconductor device according to claim 6; wherein the step of performing a wire bonding process comprises the step of using a wire bonding apparatus to bond a wire to the bonding pad.

9. A method of manufacturing a packaged semiconductor device according to claim 6; wherein the step of partially removing the protective film further comprises the step of removing the protective film to expose a portion of the bump surrounding the wire.

* * * * *